United States Patent
Pendharkar et al.

(10) Patent No.: US 9,673,273 B2
(45) Date of Patent: *Jun. 6, 2017

(54) HIGH BREAKDOWN N-TYPE BURIED LAYER

(71) Applicant: Texas Instruments Incorporated, Dallas, TX (US)

(72) Inventors: Sameer P. Pendharkar, Allen, TX (US); Binghua Hu, Plano, TX (US); Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/175,192

(22) Filed: Jun. 7, 2016

(65) Prior Publication Data
US 2016/0315141 A1    Oct. 27, 2016

Related U.S. Application Data

(63) Continuation of application No. 14/555,330, filed on Nov. 26, 2014, now Pat. No. 9,385,187.
(Continued)

(51) Int. Cl.
| | |
|---|---|
| *H01L 29/06* | (2006.01) |
| *H01L 21/02* | (2006.01) |
| *H01L 21/225* | (2006.01) |
| *H01L 21/265* | (2006.01) |
| *H01L 21/266* | (2006.01) |

(Continued)

(52) U.S. Cl.
CPC .... *H01L 29/0623* (2013.01); *H01L 21/02164* (2013.01); *H01L 21/2253* (2013.01); *H01L 21/266* (2013.01); *H01L 21/2652* (2013.01); *H01L 21/26513* (2013.01);
(Continued)

(58) Field of Classification Search
CPC .......... H01L 29/0623; H01L 21/02164; H01L 21/2253; H01L 21/26513; H01L 21/266; H01L 21/324; H01L 29/167
See application file for complete search history.

(56) References Cited

U.S. PATENT DOCUMENTS

| 4,666,556 A | 5/1987 | Fulton et al. |
| 4,980,747 A | 12/1990 | Hutter et al. |

(Continued)

FOREIGN PATENT DOCUMENTS

| CN | 101937925 | 5/2011 |
| WO | 2008086348 | 8/2008 |
| WO | 2011160041 | 12/2011 |

*Primary Examiner* — Fernando L Toledo
*Assistant Examiner* — Neil Prasad
(74) *Attorney, Agent, or Firm* — Tuenlap D. Chan; Charles A. Brill; Frank D. Cimino

(57) ABSTRACT

A semiconductor device has an n-type buried layer formed by implanting antimony and/or arsenic into the p-type first epitaxial layer at a high dose and low energy, and implanting phosphorus at a low dose and high energy. A thermal drive process diffuses and activates both the heavy dopants and the phosphorus. The antimony and arsenic do not diffuse significantly, maintaining a narrow profile for a main layer of the buried layer. The phosphorus diffuses to provide a lightly-doped layer several microns thick below the main layer. An epitaxial p-type layer is grown over the buried layer.

20 Claims, 14 Drawing Sheets

Related U.S. Application Data

(60) Provisional application No. 61/984,205, filed on Apr. 25, 2014.

(51) Int. Cl.
    *H01L 21/324*     (2006.01)
    *H01L 29/167*     (2006.01)
    *H01L 21/74*     (2006.01)

(52) U.S. Cl.
    CPC ............ *H01L 21/324* (2013.01); *H01L 21/74* (2013.01); *H01L 29/167* (2013.01)

(56) References Cited

U.S. PATENT DOCUMENTS

| | | | |
|---|---|---|---|
| 5,495,124 A | 2/1996 | Terashima | |
| 5,913,125 A | 6/1999 | Brouillette | |
| 5,994,755 A | 11/1999 | DeJong | |
| 6,218,722 B1 | 4/2001 | Cervin-Lawry et al. | |
| 7,135,380 B2 | 11/2006 | Onai | |
| 7,723,204 B2 | 5/2010 | Khemka | |
| 9,385,187 B2 * | 7/2016 | Pendharkar | H01L 21/74 |
| 2004/0032005 A1 | 2/2004 | Williams et al. | |
| 2004/0171220 A1 | 9/2004 | Yang | |
| 2004/0207047 A1 | 10/2004 | Khemka et al. | |
| 2005/0157756 A1 | 7/2005 | Ormond | |
| 2007/0020926 A1 | 1/2007 | Kalvesten et al. | |
| 2007/0246771 A1 | 10/2007 | McCormack et al. | |
| 2007/0254430 A1 | 11/2007 | Cheng | |
| 2008/0277764 A1 | 11/2008 | Ferru et al. | |
| 2009/0176375 A1 | 7/2009 | Benson et al. | |
| 2010/0240191 A1 | 9/2010 | Chung et al. | |
| 2010/0319962 A1 | 12/2010 | Clevenger et al. | |
| 2011/0275168 A1 | 11/2011 | Davis et al. | |
| 2013/0134491 A1 | 5/2013 | Messenger et al. | |
| 2013/0193502 A1 | 8/2013 | Kocon et al. | |
| 2014/0001596 A1 | 1/2014 | Hu et al. | |
| 2014/0110374 A1 | 4/2014 | Brencher et al. | |
| 2015/0097225 A1 | 4/2015 | Denison et al. | |

* cited by examiner

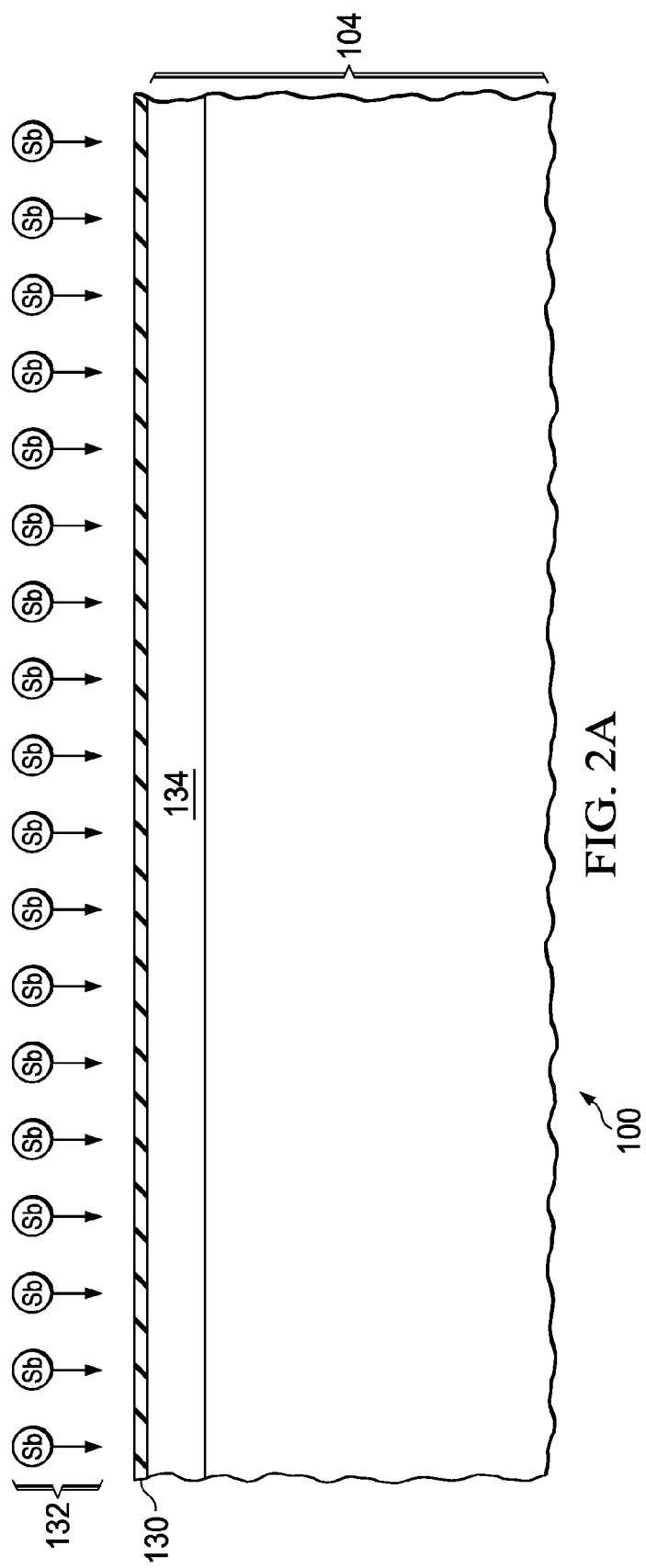

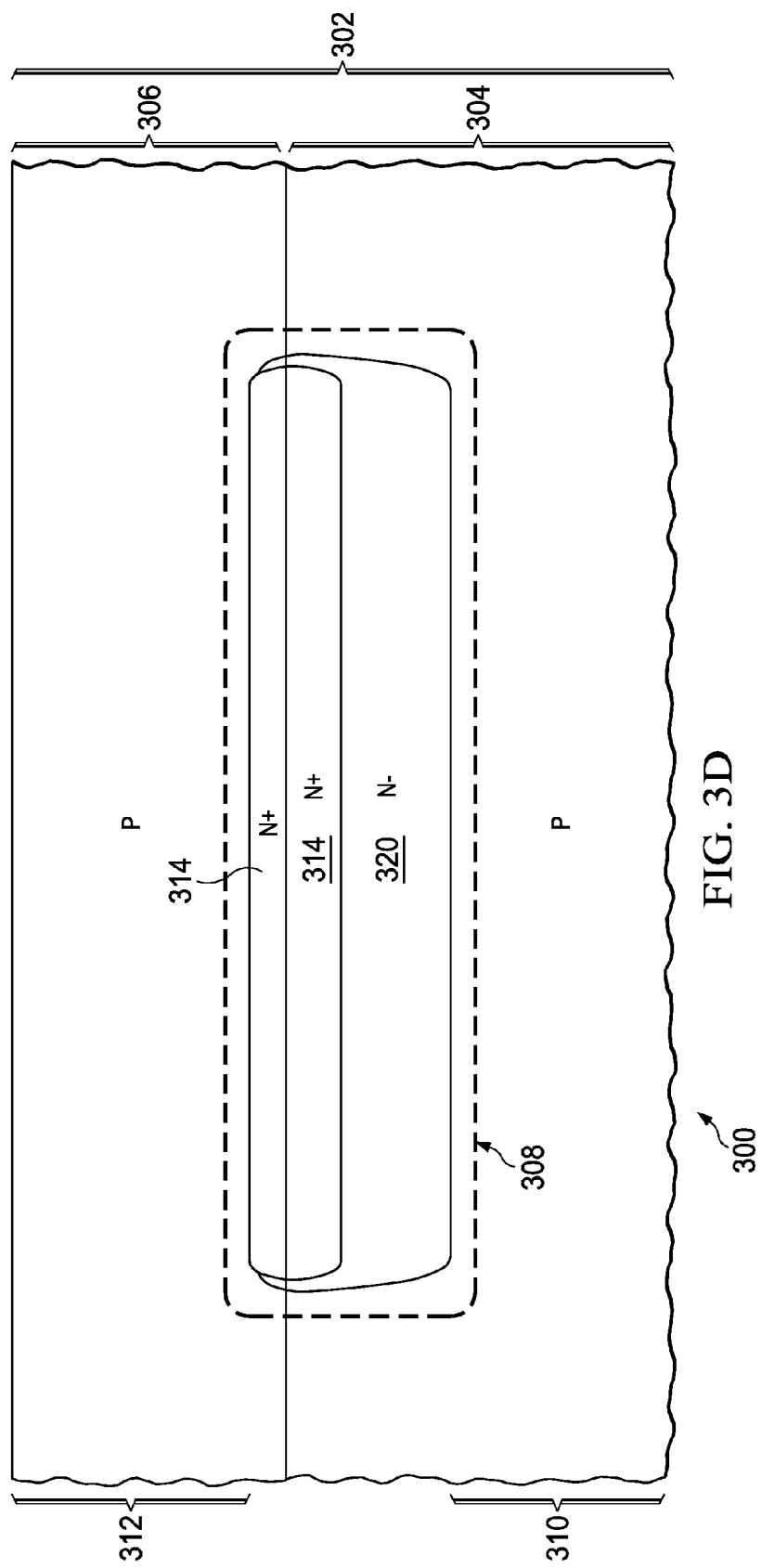

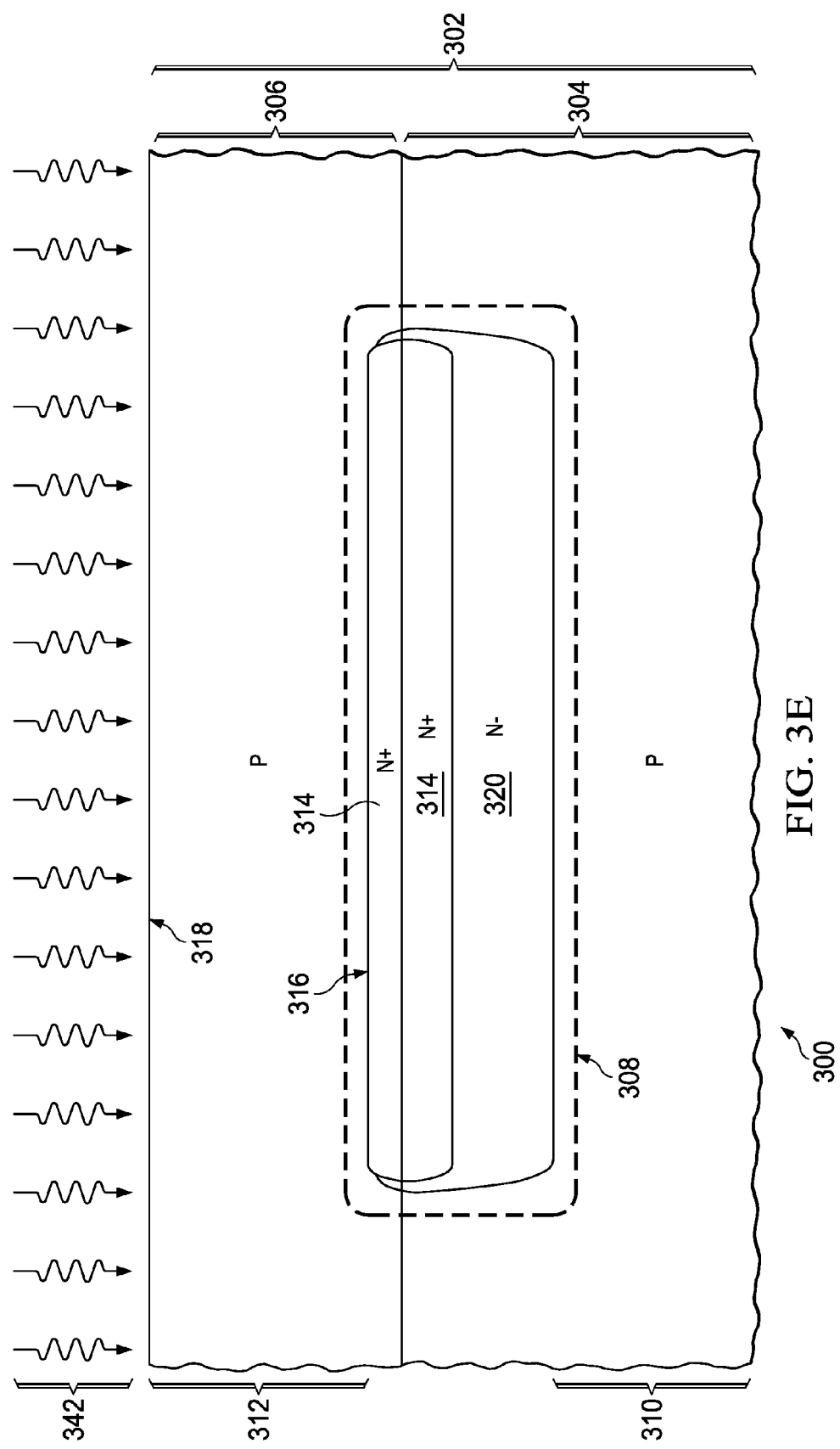

HIGH BREAKDOWN N-TYPE BURIED LAYER

CROSS-REFERENCE TO RELATED APPLICATIONS

Under 35 U.S.C. §120, this continuation application claims priority to and the benefits of U.S. patent application Ser. No. 14/555,330 (TI-72683), filed on Nov. 26, 2014, which claims priority to and the benefits of U.S. Provisional Application No. 61/984,205 (TI-72683 PS), filed on Apr. 25, 2014. The entirety of the above referenced applications is incorporated herein by reference.

FIELD

This disclosure relates to the field of semiconductor devices. More particularly, this disclosure relates to buried layers in semiconductor devices.

BACKGROUND

A semiconductor device contains an n-type buried layer in a p-type substrate. The buried layer is biased to a high voltage, above 80 volts, to provide isolated operation at high voltage for a component in the substrate above the buried layer. The pn junction at the bottom surface of the buried layer exhibits undesirable leakage current and low breakdown.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A semiconductor device has an n-type buried layer over a p-type first epitaxial layer and under a p-type second epitaxial layer. The buried layer is formed by implanting heavy n-type dopants, antimony and/or arsenic, into the p-type first epitaxial layer at a high dose and low energy, and implanting a lighter n-type dopant, phosphorus, at a low dose and high energy. A thermal drive process diffuses and activates both the heavy dopants and the phosphorus. The heavy dopants do not diffuse significantly, advantageously maintaining a narrow profile for a main layer of the buried layer. The phosphorus diffuses to advantageously provide a lightly-doped layer several microns thick below the main layer.

DESCRIPTION OF THE VIEWS OF THE DRAWING

FIG. 2A through FIG. 2F are cross sections of a semiconductor device similar to that depicted in FIG. 1, shown in successive stages of fabrication.

FIG. 3A through FIG. 3F are cross sections of another example semiconductor device containing a high voltage localized n-type buried layer, depicted in successive stages of fabrication.

DETAILED DESCRIPTION

The following co-pending patent applications are related and hereby incorporated by reference: U.S. patent application Ser. No. 14/555,209, U.S. patent application Ser. No. 14/555,300, and U.S. patent application Ser. No. 14/555,359 (now U.S. Pat. No. 9,337,292), all filed simultaneously with this application.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Figure 1:
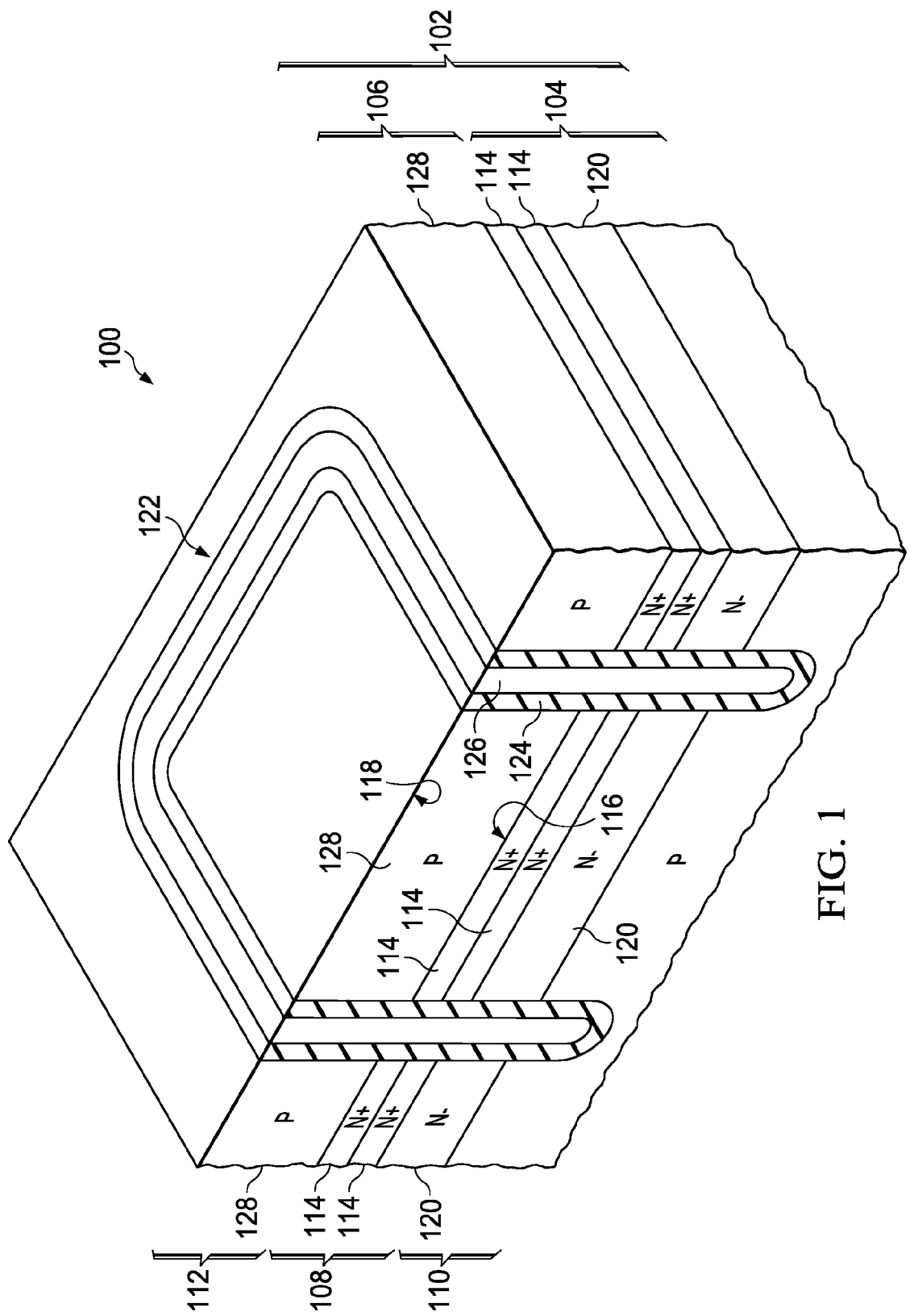
FIG. 1 is a cross section of an example semiconductor device containing a high voltage n-type buried layer.

FIG. 1 is a cross section of an example semiconductor device containing a high voltage n-type buried layer. The semiconductor device 100 has a substrate 102 which includes a first epitaxial layer 104 of semiconductor material such as single crystal silicon. The substrate 102 also includes a second epitaxial layer 106 disposed on the first epitaxial layer 104. The second epitaxial layer 106 comprises a semiconductor material which may have a same composition as the first epitaxial layer 104. An n-type buried layer 108 is disposed in the substrate 102 at a boundary between the first epitaxial layer 104 and the second epitaxial layer 106, extending into the first epitaxial layer 104 and the second epitaxial layer 106. The first epitaxial layer 104 immediately below the n-type buried layer 108 is referred to as a lower layer 110. The lower layer 110 is p-type and has a resistivity of 5 ohm-cm to 10 ohm-cm. The second epitaxial layer 106 above the n-type buried layer 108 is referred to as an upper layer 112. The upper layer 112 is p-type and has a resistivity of 5 ohm-cm to 10 ohm-cm.

The n-type buried layer 108 includes a main layer 114 which straddles the boundary between the first epitaxial layer 104 and the second epitaxial layer 106, extending at least a micron into the first epitaxial layer 104 and at least a micron into the second epitaxial layer 106. The main layer 114 has an average doping density greater than $5 \times 10^{18}$ cm$^{-3}$. At least 50 percent of the n-type dopants in the main layer 114 are arsenic and/or antimony. A top surface 116 of the main layer 114 is at least 5 microns below a top surface 118 of the substrate 102. The top surface 116 of the main layer 114 may be 8 microns to 12 microns below the top surface 118 of the substrate 102.

The n-type buried layer 108 includes a lightly-doped layer 120 extending at least 2 microns below the main layer 114; the lightly-doped layer 120 is disposed in the first epitaxial layer 104 over the lower layer 110. The lightly-doped layer 120 has an average doping density of $1 \times 10^{16}$ cm$^{-3}$ to $1 \times 10^{17}$ cm$^{-3}$. At least 90 percent of the n-type dopants in the lightly-doped layer 120 are phosphorus. The n-type buried layer 108 may extend substantially across the semiconductor device 100 as indicated in FIG. 1.

During operation of the semiconductor device 100, the n-type buried layer 108 may be biased 80 volts to 110 volts higher than the lower layer 110. The structure of the n-type buried layer 108 with the lightly-doped layer 120 may advantageously prevent breakdown of a pn junction between the n-type buried layer 108 and the lower layer 110, and may advantageously provide a desired low level of leakage current. Moreover, the structure of the n-type buried layer 108 with the main layer 114 advantageously provides a low sheet resistance so as to maintain a uniform bias for components in the upper layer 112 above the n-type buried layer 108.

The semiconductor device 100 may include a deep trench structure 122 which extends through the upper layer 112, through the n-type buried layer 108, and into the lower layer 110. The deep trench structure 122 includes a dielectric liner 124 including silicon dioxide contacting the semiconductor material of the substrate 102. The deep trench structure 122 may also include an electrically conductive fill material 126 such as polycrystalline silicon, referred to as polysilicon, on the dielectric liner 124. The structure of the n-type buried layer 108 with the lightly-doped layer 120 is especially advantageous for preventing breakdown of the pn junction between the n-type buried layer 108 and the lower layer 110 at the dielectric liner 124. The deep trench structure 122 may have a closed loop configuration as depicted in FIG. 1 so that a portion 128 of the upper layer 112 is electrically isolated from the remaining upper layer 112 by the deep trench structure 122 and is electrically isolated from the lower layer 110 by the n-type buried layer 108. Components in the portion 128 of the upper layer 112 may be advantageously operated at 85 volts to 110 volts components in the remaining upper layer 112 outside the deep trench structure 122.

Figure 2B:
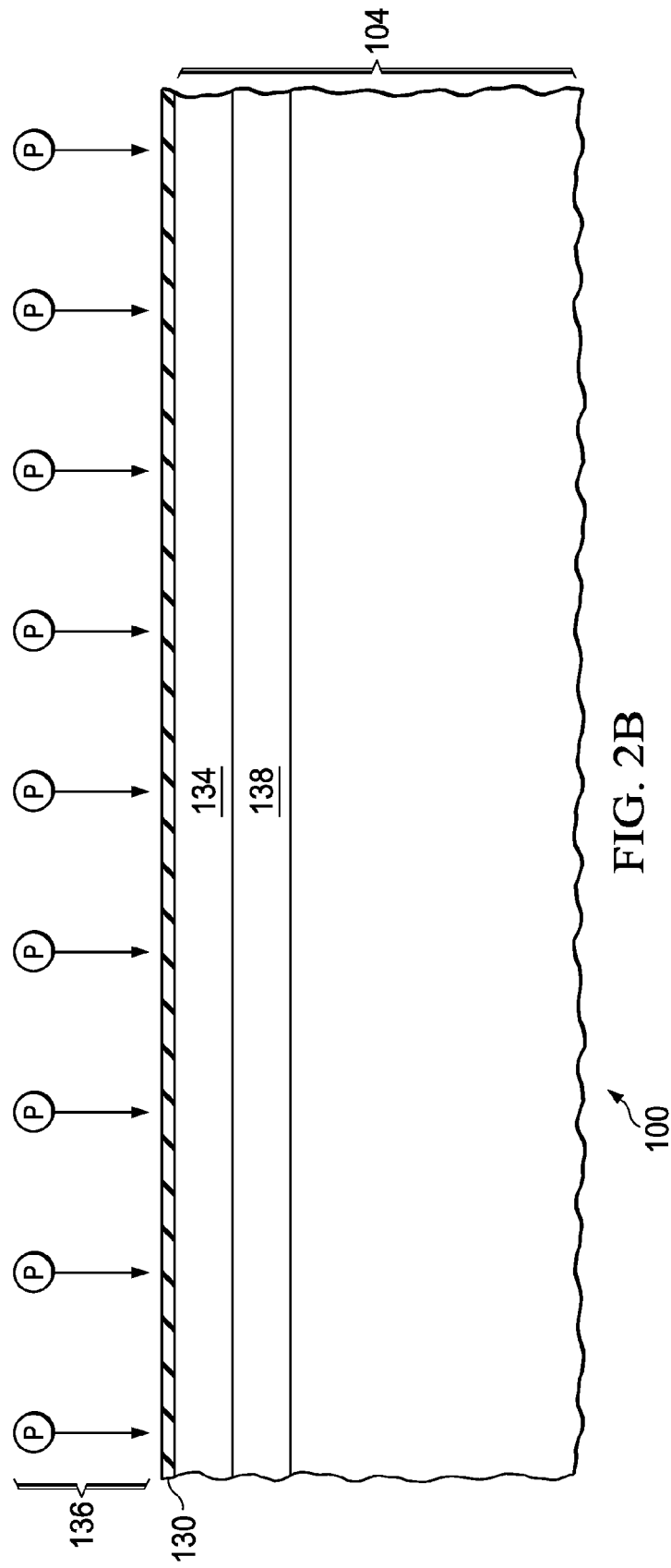

FIG. 2A through FIG. 2F are cross sections of a semiconductor device similar to that depicted in FIG. 1, shown in successive stages of fabrication. Referring to FIG. 2A, fabrication of the semiconductor device 100 starts with the first epitaxial layer 104. The first epitaxial layer 104 may be, for example, a top portion of a stack of epitaxial layers on a heavily-doped single crystal silicon wafer. The first epitaxial layer 104 is p-type with a resistivity of 5 ohm-cm to 10 ohm-cm. A layer of pad oxide 130 is formed over the first epitaxial layer 104, for example by thermal oxidation.

N-type dopants 132 are implanted into the first epitaxial layer 104 to form a first implanted layer 134. The n-type dopants include at least 50 percent arsenic and/or antimony. In one version of the instant example, the n-type dopants 132 may be substantially all antimony, as indicated in FIG. 2A. The n-type dopants 132 are implanted at a dose greater than $5 \times 10^{14}$ cm$^{-2}$, for example, $1 \times 10^{15}$ cm$^{-2}$ to $5 \times 10^{15}$ cm$^{-2}$. Antimony in the n-type dopants 132 may be implanted at energies less than 50 keV. Arsenic in the n-type dopants 132 may be implanted at energies less than 40 keV.

Referring to FIG. 2B, phosphorus 136 is implanted into the first epitaxial layer 104 to form a second implanted layer 138 below the first implanted layer 134. The phosphorus 136 is implanted at a dose of $1 \times 10^{13}$ cm$^{-2}$ to $1 \times 10^{14}$ cm$^{-2}$ and at an energy above 100 keV.

Figure 2C:
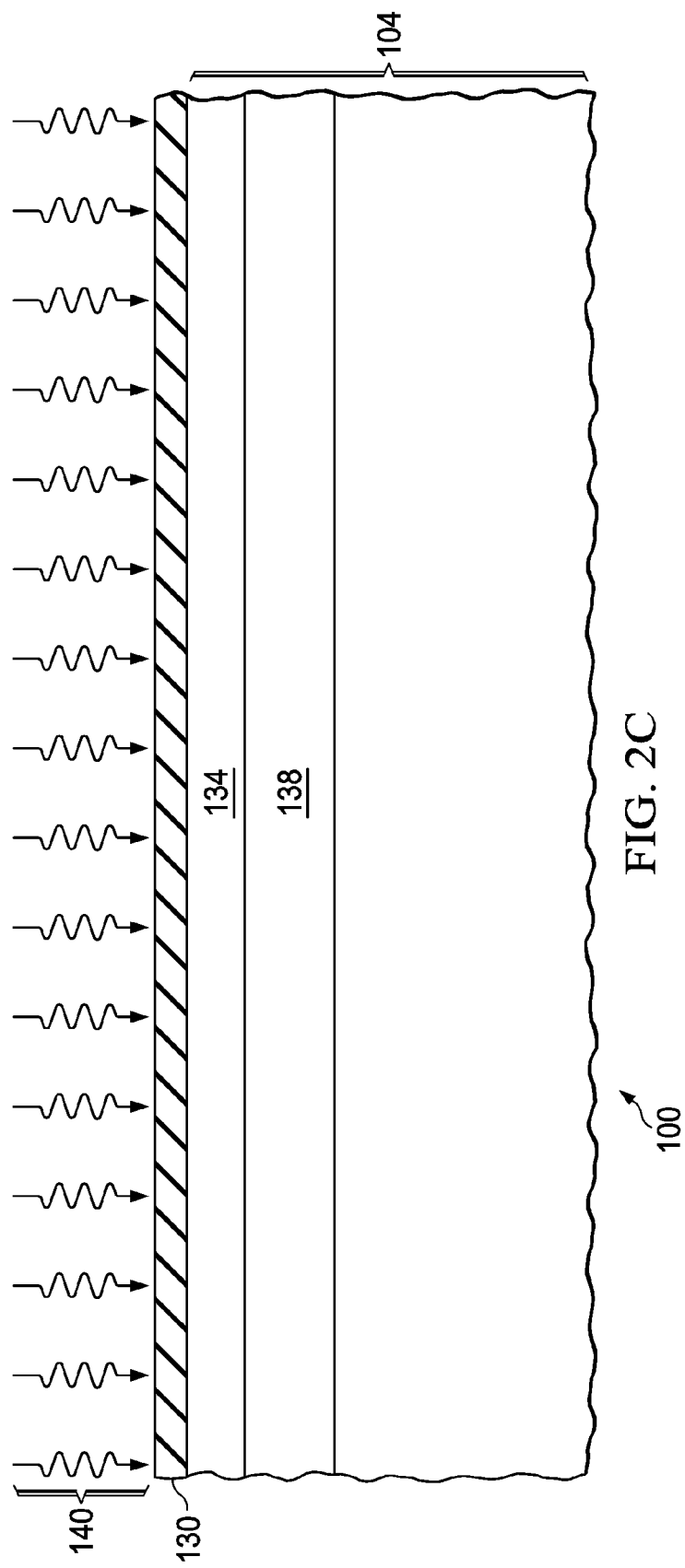

Referring to FIG. 2C, a first thermal drive process 140 heats the first epitaxial layer 104 to a temperature of 1150° C. to 1225° C. for at least 30 minutes. The first thermal drive process 140 may be performed in a furnace with an oxidizing ambient which increases a thickness of the layer of pad oxide 130. The first thermal drive process 140 causes the implanted n-type dopants in the first implanted layer 134 and the implanted phosphorus in the second implanted layer 138 to diffuse deeper into the first epitaxial layer 104. The phosphorus in the second implanted layer 138 diffuses farther into the first epitaxial layer 104 than the arsenic and antimony in the first implanted layer 134. The layer of pad oxide 130 is subsequently removed, for example by a wet etch using a dilute aqueous solution of buffered hydrofluoric acid.

Figure 2D:
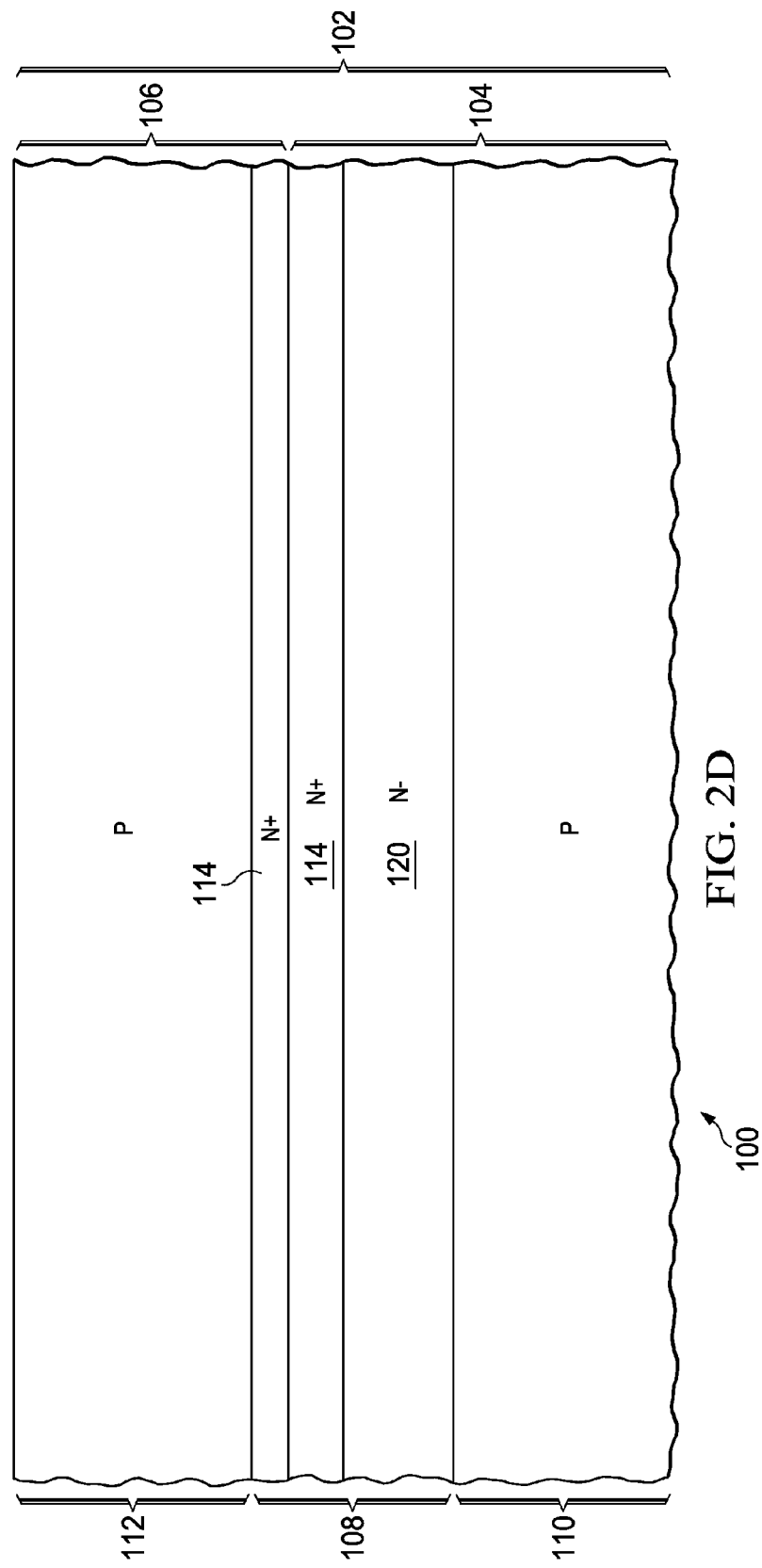

Referring to FIG. 2D, an epitaxy process grows the second epitaxial layer 106 on the first epitaxial layer 104. The epitaxy process may use silane, dichlorosilane, or other silicon-containing reagents. During the epitaxy process, the n-type dopants in the first implanted layer 134 of FIG. 2C diffuse into the second epitaxial layer 106, to form the main layer 114 of the n-type buried layer 108. The main layer 114 straddles the boundary between the first epitaxial layer 104 and the second epitaxial layer 106. The phosphorus in the second implanted layer 138 of FIG. 2C forms the lightly-doped layer 120 of the n-type buried layer 108. The epitaxy process may use a boron-containing reagent such as diborane to provide p-type doping in the second epitaxial layer 106. Alternatively, p-type dopants such as boron may be implanted into the second epitaxial layer 106 after the epitaxy process is completed. The first epitaxial layer 104 and the second epitaxial layer 106 provide a top portion of the substrate 102.

Figure 2E:
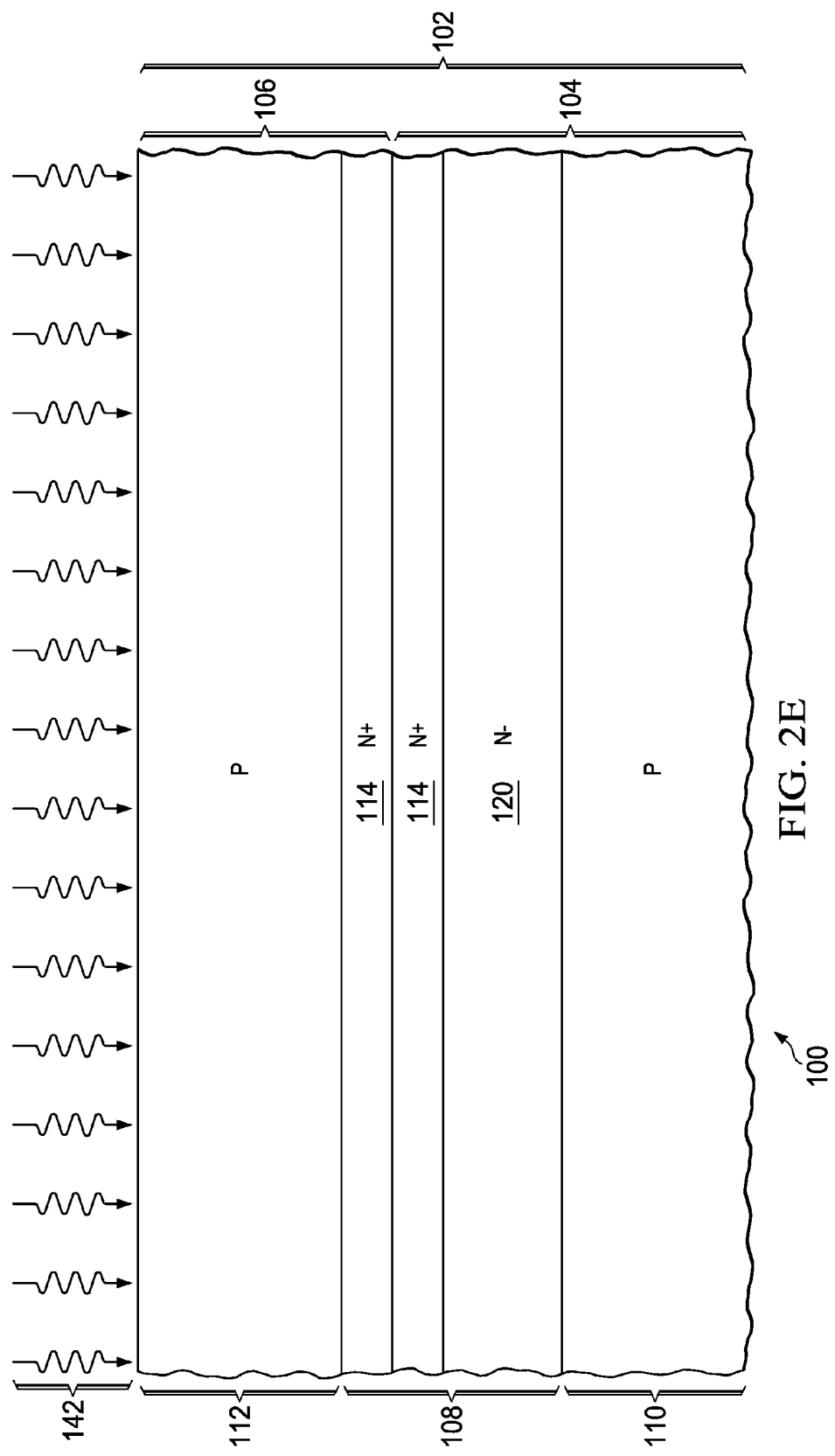

Referring to FIG. 2E, a second thermal drive process 142 heats the substrate 102 to a temperature of 1125° C. to 1200° C. for at least 120 minutes. The second thermal drive process 142 may be performed in a furnace with a slightly oxidizing ambient. When the second thermal drive is completed, the main layer 114 of the n-type buried layer 108 extends at least a micron into the first epitaxial layer 104 and at least a micron into the second epitaxial layer 106, and the lightly-doped layer 120 extends at least 2 microns below the main layer 114. An average doping in the main layer 114 is greater than $5 \times 10^{18}$ cm$^{-3}$. An average doping in the lightly-doped layer 120 is $1 \times 10^{16}$ cm$^{-3}$ to $1 \times 10^{17}$ cm$^{-3}$.

Figure 2F:
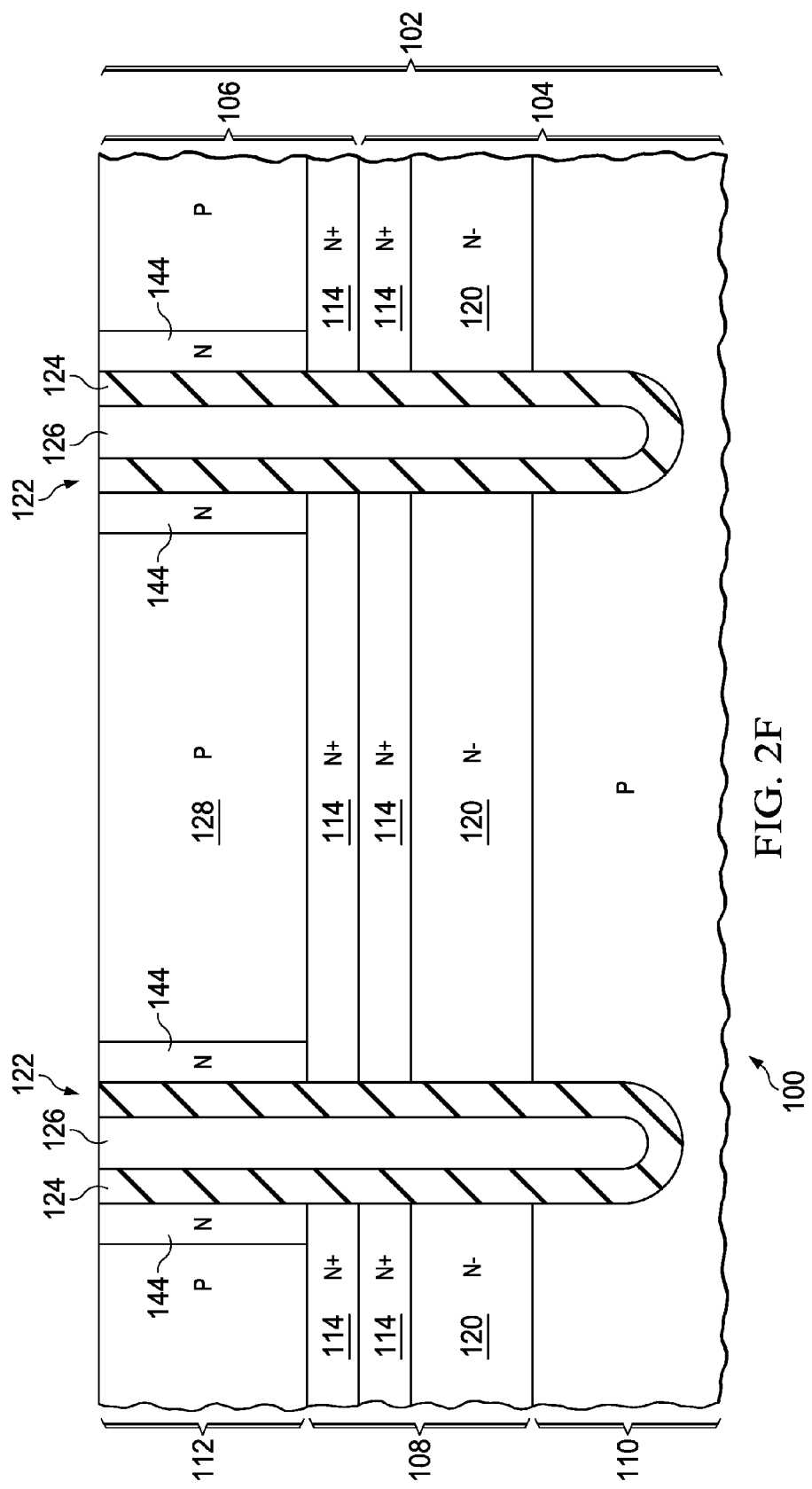

Referring to FIG. 2F, the deep trench structure 122 may be formed by etching a deep trench in the substrate 102 after the second thermal drive process 142 of FIG. 2E. The dielectric liner 124 may be formed by thermal oxidation followed by deposition of silicon dioxide by a sub-atmospheric chemical vapor deposition (SACVD) process. The electrically conductive fill material 126 may be formed by depositing a conformal layer of polysilicon and subsequently removing the polysilicon from over a top surface of the substrate, for example by a chemical mechanical polish (CMP) process. Optional n-type self-aligned sinkers 144 may be formed in the second epitaxial layer 106 abutting the deep trench structures by implanting n-type dopants into the second epitaxial layer 106 after the deep trenches are partially etched. The n-type self-aligned sinkers 144 provide electrical connections to the n-type buried layer 108.

Figure 3A:
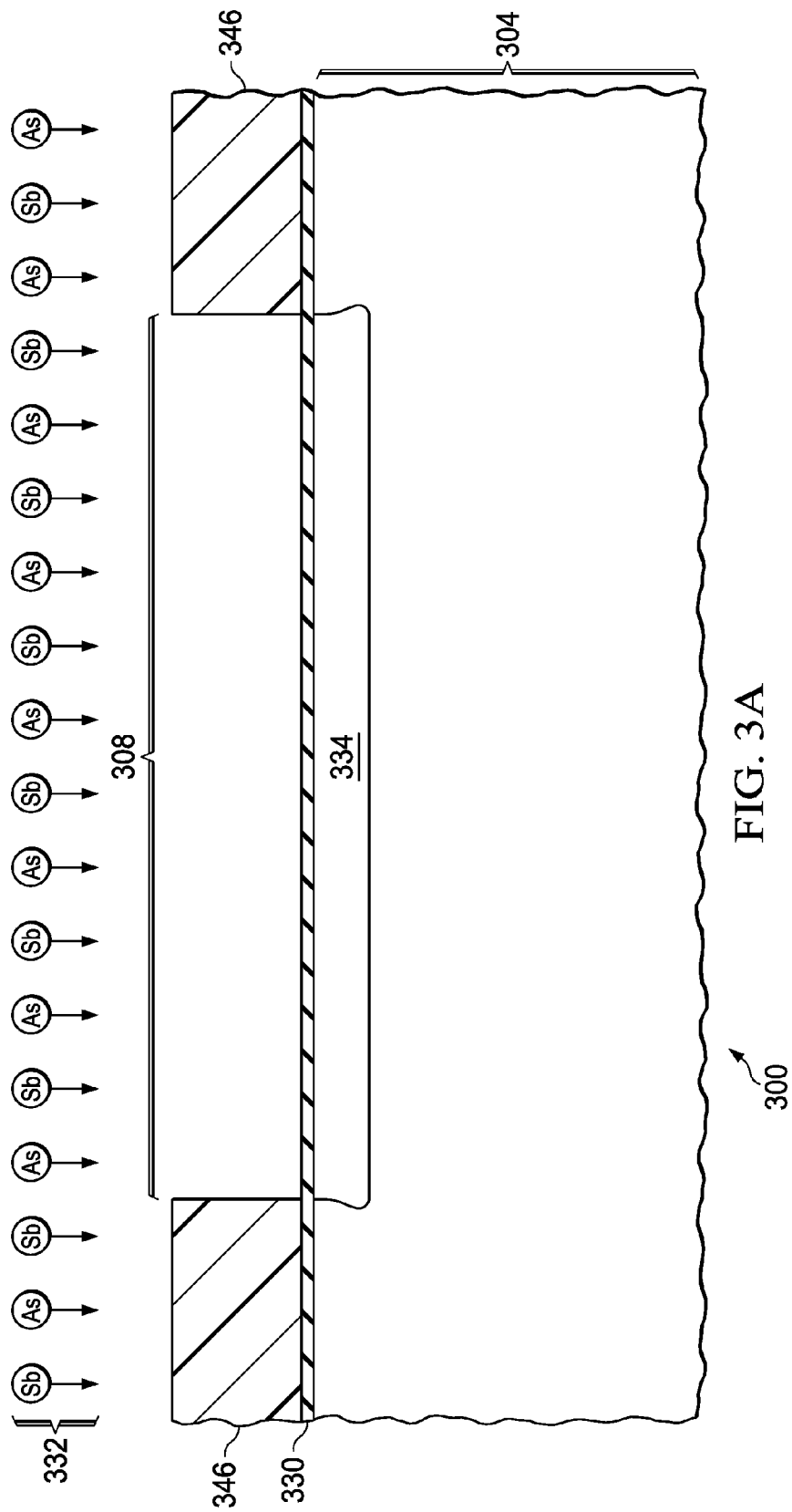

FIG. 3A through FIG. 3F are cross sections of another example semiconductor device containing a high voltage localized n-type buried layer, depicted in successive stages of fabrication. A localized n-type buried layer extends across only a portion of the semiconductor device. Referring to FIG. 3A, the semiconductor device 300 is formed on a first epitaxial layer 304 containing a semiconductor material such as single crystal silicon. The first epitaxial layer 304 is p-type with a resistivity of 5 ohm-cm to 10 ohm-cm. A layer of pad oxide 330 is formed over the first epitaxial layer 304. In the instant example, an implant mask 346 is formed over the layer of pad oxide 330 so as to expose an area for the localized n-type buried layer 308. The implant mask 346 may include photoresist formed by a photolithographic process, or may include hard mask material such as silicon dioxide formed by a thermal oxidation or a plasma enhanced chemical vapor (PECVD) process. Including hard mask material in the implant mask 346 may advantageously facilitate subsequent removal of the implant mask 346 after implanting phosphorus at high energies.

N-type dopants 332 are implanted through the area exposed by the implant mask 346 into the first epitaxial layer 304 to form a first implanted layer 334. The n-type dopants includes at least 50 percent arsenic and/or antimony. The n-type dopants 332 are implanted at a dose greater than $5 \times 10^{14}$ cm$^{-2}$, for example, $1 \times 10^{15}$ cm$^{-2}$ to $5 \times 10^{15}$ cm$^{-2}$.

Figure 3B:
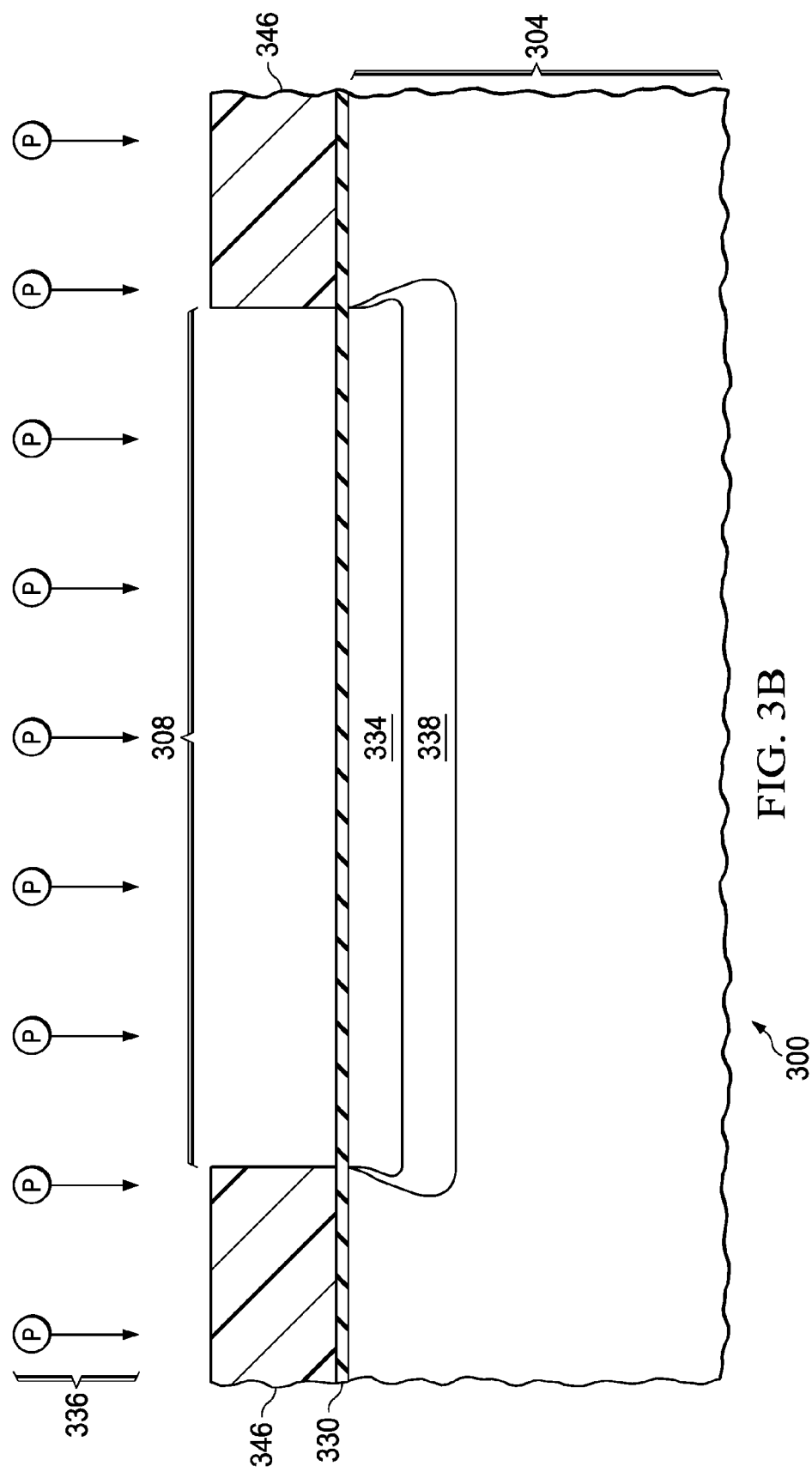

Referring to FIG. 3B, phosphorus 336 is implanted through the area exposed by the implant mask 346 into the first epitaxial layer 304 to form a second implanted layer 338 below the first implanted layer 334. The phosphorus 336 is implanted at a dose of $1 \times 10^{13}$ cm$^{-2}$ to $1 \times 10^{14}$ cm$^{-2}$ and at an energy above 100 keV. Organic material in the implant mask 346 such as photoresist is removed before a subsequent first thermal drive process.

Figure 3C:
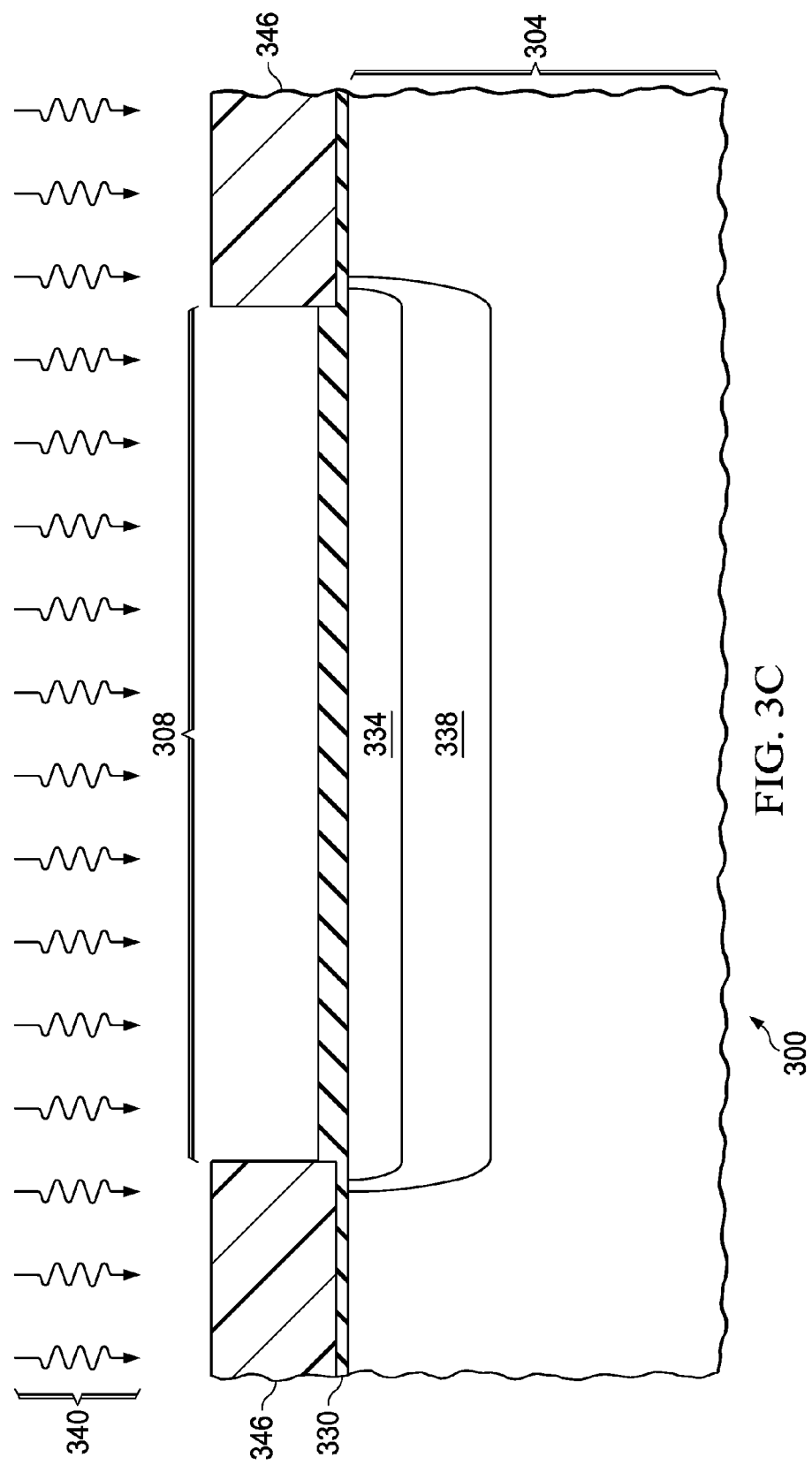

Referring to FIG. 3C, a first thermal drive process 340 heats the first epitaxial layer 304 to a temperature of 1150° C. to 1225° C. for at least 30 minutes, for example as described in reference to FIG. 2C. The first thermal drive process 340 causes the implanted n-type dopants in the first implanted layer 334 and the implanted phosphorus in the second implanted layer 338 to diffuse deeper into the first epitaxial layer 304. The phosphorus in the second implanted layer 338 diffuses farther into the first epitaxial layer 304 than the arsenic and antimony in the first implanted layer 334. The implant mask 346 if present and the layer of pad oxide 330 are subsequently removed.

Referring to FIG. 3D, an epitaxy process grows a second epitaxial layer 306 on the first epitaxial layer 304 to provide a substrate 302 of the semiconductor device 300. During the epitaxy process, the n-type dopants in the first implanted layer 334 of FIG. 3C diffuse into the second epitaxial layer 306, to form a main layer 314 of the localized n-type buried layer 308. The main layer 314 straddles a boundary between the first epitaxial layer 304 and the second epitaxial layer 306. The phosphorus in the second implanted layer 338 of FIG. 3C forms a lightly-doped layer 320 of the localized n-type buried layer 308 below the main layer 314. The second epitaxial layer 306 is p-type with a resistivity of 5 ohm-cm to 10 ohm-cm. The first epitaxial layer 304 immediately below the n-type buried layer 308 is referred to as a lower layer 310; analogously, the second epitaxial layer 306 above the n-type buried layer 308 is referred to as an upper layer 312.

Referring to FIG. 3E, a second thermal drive process 342 heats the substrate 302 to a temperature of 1125° C. to 1200° C. for at least 120 minutes. When the second thermal drive is completed, the main layer 314 of the localized n-type buried layer 308 extends at least a micron into the first epitaxial layer 304 and at least a micron into the second epitaxial layer 306, and the lightly-doped layer 320 extends at least 2 microns below the main layer 314. A top surface 316 of the main layer 314 is at least 5 microns below a top surface 318 of the substrate 302. The top surface 316 of the main layer 314 may be 8 microns to 12 microns below the top surface 318 of the substrate 302. An average doping in the main layer 314 is greater than $5 \times 10^{18}$ cm$^{-3}$. At least 50 percent of the n-type dopants in the main layer 314 are arsenic and/or antimony.

The lightly-doped layer 320 extends at least 2 microns below the main layer 314. An average doping in the lightly-doped layer 320 is $1 \times 10^{16}$ cm$^{-3}$ to $1 \times 10^{17}$ cm$^{-3}$. At least 90 percent of the n-type dopants in the lightly-doped layer 320 are phosphorus.

Figure 3F:
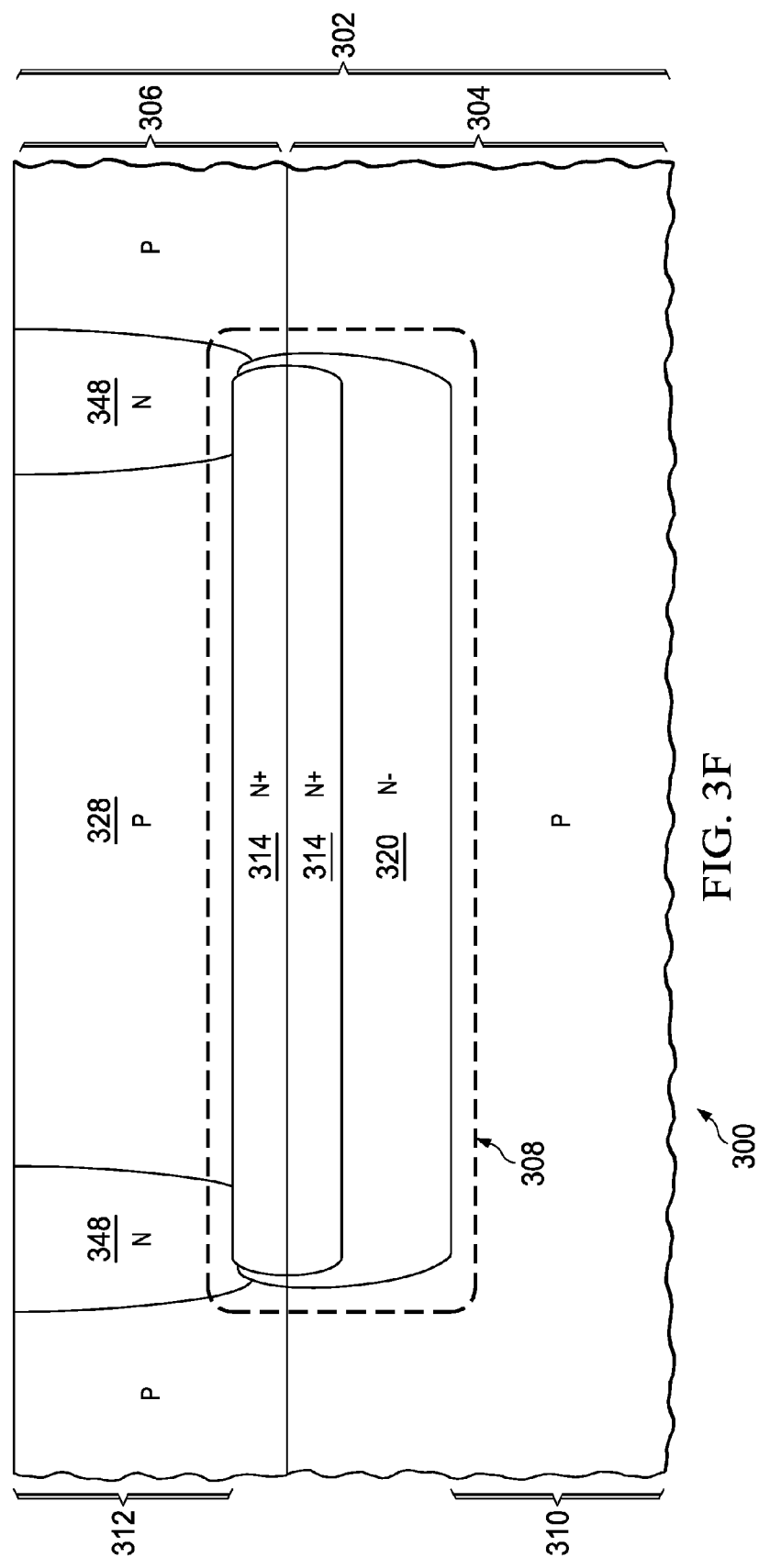

Referring to FIG. 3F, n-type sinkers 348 are formed in the second epitaxial layer 306, extending down to the localized n-type buried layer 308. The n-type sinkers 348 may have a closed-loop configuration so as to isolate a portion 328 of the upper layer 312 from the remaining upper layer 312. The localized n-type buried layer 308 isolates the portion 328 of the upper layer 312 from the lower layer 310. The structure of the localized n-type buried layer 308 with the main layer 314 and the lightly-doped layer 320 may advantageously provide a low sheet resistance in the localized n-type buried layer 308 while reducing leakage current and preventing breakdown of a pn junction between the localized n-type buried layer 308 and the lower layer 310.

Figure 4:
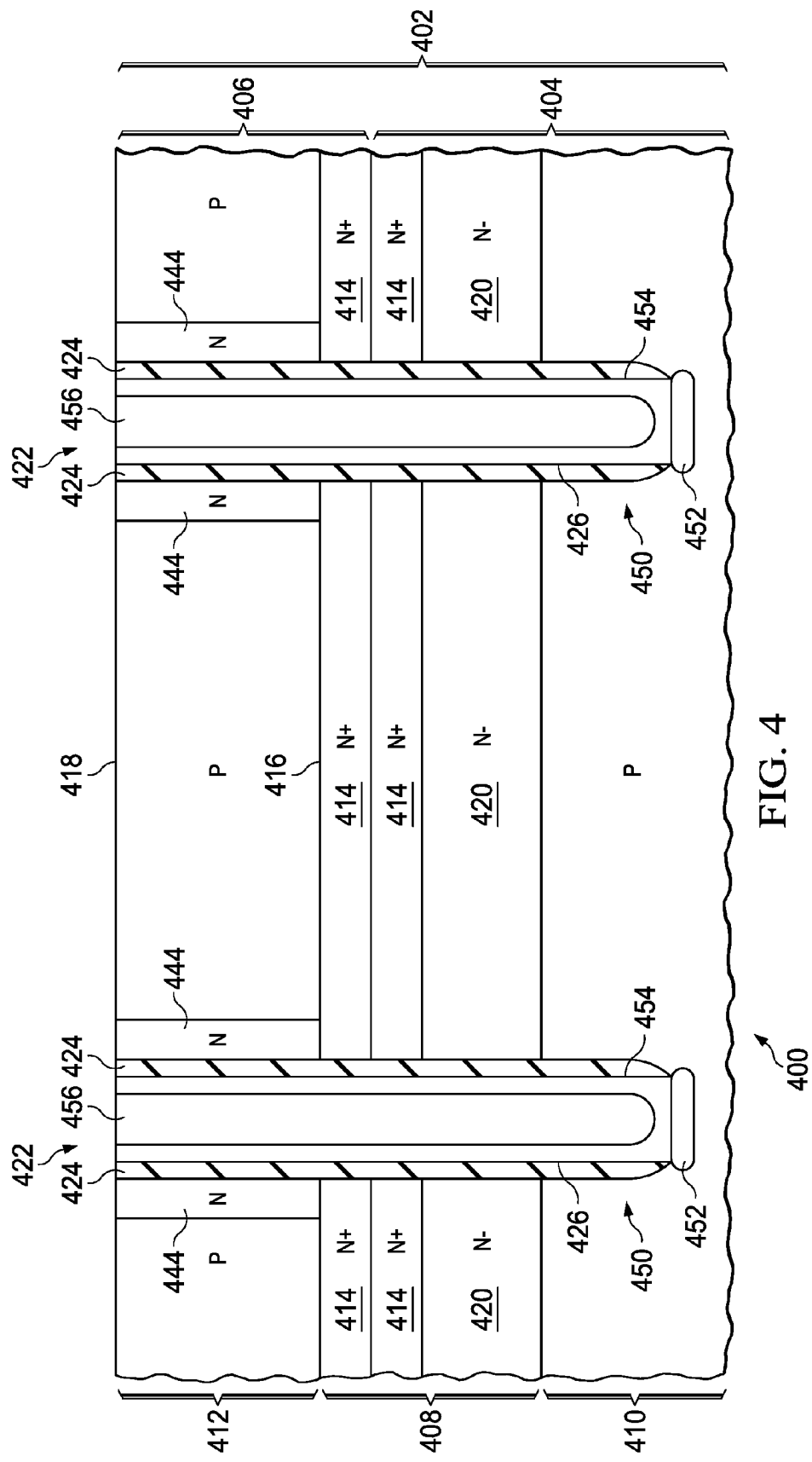
FIG. 4 is a cross section of an alternate example semiconductor device containing a high voltage n-type buried layer.

FIG. 4 is a cross section of an alternate example semiconductor device containing a high voltage n-type buried layer. The semiconductor device 400 has a substrate 402 which includes a first epitaxial layer 404 of p-type semiconductor material such as single crystal silicon. The substrate 402 also includes a second epitaxial layer 406 disposed on the first epitaxial layer 404. The second epitaxial layer 406 comprises a p-type semiconductor material which may have a same composition as the first epitaxial layer 404. An n-type buried layer 408 is disposed in the substrate 402 at a boundary between the first epitaxial layer 404 and the second epitaxial layer 406, extending into the first epitaxial layer 404 and the second epitaxial layer 406. The first epitaxial layer 404 immediately below the n-type buried layer 408 is referred to as a lower layer 410. The lower layer 410 is p-type and has a resistivity of 5 ohm-cm to 10 ohm-cm. The second epitaxial layer 406 above the n-type buried layer 408 is referred to as an upper layer 412. The upper layer 412 is p-type and has a resistivity of 5 ohm-cm to 10 ohm-cm.

The n-type buried layer 408 includes a main layer 414 which straddles the boundary between the first epitaxial layer 404 and the second epitaxial layer 406, extending at least a micron into the first epitaxial layer 404 and at least a micron into the second epitaxial layer 406. The main layer 414 has an average doping density greater than $5 \times 10^{18}$ cm$^{-3}$. A top surface 416 of the main layer 414 is at least 5 microns below a top surface 418 of the substrate 402. The top surface 416 of the main layer 414 may be 8 microns to 12 microns below the top surface 418 of the substrate 402 The n-type buried layer 408 includes a lightly-doped layer 420 extending at least 2 microns below the main layer 414; the lightly-doped layer 420 is disposed in the first epitaxial layer 404 over the lower layer 410. The lightly-doped layer 420 has an average doping density of $1 \times 10^{16}$ cm$^{-3}$ to $1 \times 10^{17}$ cm$^{-3}$. The n-type buried layer 408 may be formed as described in any of the examples herein.

One or more deep trench structures 422 are disposed in the substrate 402, extending below the buried layer 408 into the lower layer 410. The deep trench structures 422 include dielectric liners 424 contacting the substrate 402. The deep trench structures 422 include electrically conductive trench fill material 426 on the dielectric liners 424. In the instant example, the dielectric liner 424 is removed at bottoms 450 of the deep trench structures 422 and the trench fill material 426 extends to the substrate 402, making electrical connection to the substrate 402 through a p-type contact region 452. The contact region 452 and the method of removing the dielectric liner 424 at the bottom 450 of each deep trench structure 422 may be done as described in the commonly assigned patent application having patent application Ser.

No. 14/555,359, filed concurrently with this application, and which is incorporated herein by reference.

In the instant example, the trench fill material 426 includes a first layer of polysilicon 454 disposed on the dielectric liner 424, extending to the bottoms 450 of the deep trench structures 422, and a second layer of polysilicon 456 is disposed on the first layer of polysilicon 454. Dopants are distributed in the first layer of polysilicon 454 and the second layer of polysilicon 456 with an average doping density of at least $1\times10^{18}$ cm$^{-3}$. The trench fill material 426 may be formed as described in the commonly assigned patent application having patent application Ser. No. 14/555,300, filed concurrently with this application, and which is incorporated herein by reference.

N-type self-aligned sinkers 444 are disposed in the upper layer 412 abutting the deep trench structures 422 and extending to the buried layer 408. The self-aligned sinkers 444 provide electrical connections to the buried layer 408. The self-aligned sinkers 444 may be formed as described in the commonly assigned patent application having patent application Ser. No. 14/555,209, filed concurrently with this application, and which is incorporated herein by reference.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A semiconductor device, comprising:
    a substrate comprising a p-type semiconductor material;
    an n-type buried layer disposed in the substrate, the n-type buried layer comprising:
        a main layer having a first doping concentration with dopants selected from a group consisting of antimony, arsenic, and combinations thereof, and the main layer having a buried top surface below a top surface of the substrate; and
        a lightly-doped layer positioned below the main layer, the lightly-doped layer having a second doping concentration lower than the first doping concentration.

2. The semiconductor device of claim 1, wherein the p-type semiconductor material has a resistivity of 5 ohm-cm to 10 ohm-cm.

3. The semiconductor device of claim 1, wherein at least 50 percent of the dopants in the main layer include antimony.

4. The semiconductor device of claim 1, further comprising:
    a deep trench structure extending from the top surface of the substrate through the n-type buried layer to reach a lower layer of the substrate without penetrating through the substrate, the deep trench structure including a dielectric liner coating a bottom portion of the deep trench structure and contacting the substrate.

5. The semiconductor device of claim 4, wherein the deep trench structure has a closed-loop configuration defined on the top surface of the substrate.

6. The semiconductor device of claim 4, further comprising:
    n-type sinkers extending from the top surface of the substrate and abutting the deep trench structure and the buried top surface of the n-type buried layer.

7. The semiconductor device of claim 1, further comprising:
    an n-type sinker disposed in the substrate, and the n-type sinker extending to the buried top surface of the n-type buried layer, the n-type sinker having a closed-loop configuration.

8. The semiconductor device of claim 1, wherein:
    the first doping concentration is greater than $5\times10^{18}$ cm$^{-3}$; and
    the second doping concentration ranges from $1\times10^{16}$ cm$^{-3}$ to $1\times10^{17}$ cm$^{-3}$.

9. The semiconductor device of claim 1, wherein the first doping concentration is greater than the second doping concentration by at least 50 times.

10. The semiconductor device of claim 1, further comprising:
    an electrode coupled to the n-type buried layer, and configured to bias the n-type buried layer between 80 volts and 110 volts.

11. A semiconductor device, comprising:
    a first semiconductor layer including first dopants of a first conductivity type;
    a second semiconductor layer positioned on the first semiconductor layer, the second semiconductor layer including second dopants of the first conductivity type, and the second semiconductor layer having a top surface facing away from the first semiconductor layer; and
    a buried layer positioned within a junction between the first semiconductor layer and the second semiconductor layer, the buried layer having:
        a first buried layer within the first semiconductor layer, the first buried layer including third dopants of a second conductivity type opposite of the first conductivity type, the first buried layer having a first doping concentration; and
        a second buried layer positioned on the first buried layer, the second buried layer including fourth dopants of the second conductivity type and at a second doping concentration higher than the first doping concentration.

12. The semiconductor device of claim 11, wherein the second buried layer extends across the junction between the first semiconductor layer and the second semiconductor layer.

13. The semiconductor device of claim 11, wherein the second buried layer includes:
    a top layer positioned in the second semiconductor layer; and
    a bottom layer positioned in the first semiconductor layer, and abutting the top layer.

14. The semiconductor device of claim 11, wherein:
    the first and second dopants each include a p-type semiconductor material; and
    the third and fourth dopants each include an n-type semiconductor material.

15. The semiconductor device of claim 11, wherein:
    the third dopants include at least 90 percent of phosphorus; and
    the fourth dopants include at least 50 percent of an n-type dopants selected from a group consisting of arsenic, antimony, and combinations thereof.

16. The semiconductor device of claim 11, further comprising:
    a deep trench structure extending from the top surface of the second semiconductor layer through the buried layer to reach the first semiconductor layer without penetrating through the first semiconductor layer, the deep trench structure including a dielectric liner coating a bottom portion of the deep trench structure and contacting the first semiconductor layer.

17. The semiconductor device of claim 11, further comprising:
a sinker extending from the second semiconductor layer to the buried layer, the sinker having a closed-loop configuration.

18. The semiconductor device of claim 11, wherein:
the first doping concentration is greater than $5 \times 10^{18}$ cm$^{-3}$; and
the second doping concentration ranges from $1 \times 10^{16}$ cm$^{-3}$ to $1 \times 10^{17}$ cm$^{-3}$.

19. The semiconductor device of claim 11, wherein the first doping concentration is greater than the second doping concentration by at least 50 times.

20. The semiconductor device of claim 11, further comprising:
an electrode coupled to the buried layer, and configured to bias the buried layer between 80 volts and 110 volts.

* * * * *